(12) United States Patent
Gu et al.

(10) Patent No.: US 8,796,741 B2
(45) Date of Patent: Aug. 5, 2014

(54) SEMICONDUCTOR DEVICE AND METHODS OF MAKING SEMICONDUCTOR DEVICE USING GRAPHENE

(71) Applicant: Qualcomm Incorporated, San Diego, CA (US)

(72) Inventors: Shiqun Gu, San Diego, CA (US); Yang Du, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/644,720

(22) Filed: Oct. 4, 2012

(65) Prior Publication Data

US 2013/0082235 A1   Apr. 4, 2013

Related U.S. Application Data

(60) Provisional application No. 61/542,843, filed on Oct. 4, 2011.

(51) Int. Cl.
*H01L 27/10* (2006.01)

(52) U.S. Cl.
USPC .......... 257/211; 257/27; 257/29; 257/750; 257/E21.499

(58) Field of Classification Search
CPC ..................................................... H01L 29/16
USPC ........ 257/27, 29, 24, 750, 211, 347; 438/197, 438/287, E21.409
See application file for complete search history.

(56) References Cited

U.S. PATENT DOCUMENTS

| | | | |
|---|---|---|---|
| 8,587,067 B2 * | 11/2013 | Chang et al. | ................... 257/347 |
| 2009/0114903 A1 | 5/2009 | Kalburge | |
| 2009/0155963 A1 | 6/2009 | Hawkins et al. | |
| 2009/0174435 A1 | 7/2009 | Stan et al. | |
| 2010/0163285 A1 | 7/2010 | Marinero | |
| 2011/0006425 A1 | 1/2011 | Wada et al. | |
| 2011/0042649 A1 | 2/2011 | Duvall et al. | |
| 2011/0059599 A1 * | 3/2011 | Ward et al. | ................... 438/507 |
| 2011/0210314 A1 | 9/2011 | Chung et al. | |
| 2011/0215300 A1 * | 9/2011 | Guo et al. | ....................... 257/29 |

FOREIGN PATENT DOCUMENTS

JP       2010177408       8/2010

OTHER PUBLICATIONS

International Search Report—PCT/US2012/058773—ISA/EPO—Jan. 2, 2013.
Kim, S.M., et al., "Non-volatile graphene channel memory (NVGM) for flexible electronics and 3D multi-stack ultra-high-density data storages", VLSI Technology (VLSIT), 2011 Symposium on, IEEE, Jun. 14 , 2011, pp. 118-119, XP032018996, ISBN: 978-01-4244-9949-6.

* cited by examiner

*Primary Examiner* — Dung A. Le
(74) *Attorney, Agent, or Firm* — Michelle S. Gallardo (57) ABSTRACT

A semiconductor device and methods of making a semiconductor device using graphene are described. A monolithic three dimensional integrated circuit device includes a first layer having first active devices. The monolithic three dimensional integrated circuit device also includes a second layer having second active devices that each include a graphene portion. The second layer can be fabricated on the first layer to form a stack of active devices. A base substrate may support the stack of active devices.

18 Claims, 8 Drawing Sheets

United States Patent No. US 8,796,741 B2

SEMICONDUCTOR DEVICE AND METHODS OF MAKING SEMICONDUCTOR DEVICE USING GRAPHENE

CROSS-REFERENCE TO RELATED APPLICATION

The present application claims the benefit of U.S. Provisional Patent Application No. 61/542,843 filed on Oct. 4, 2011, in the names of S. Gu et al., the disclosure of which is expressly incorporated by reference herein in its entirety.

TECHNICAL FIELD

The present disclosure relates, in general, to integrated circuits. More specifically, the disclosure relates to monolithic three dimensional integration using graphene.

BACKGROUND

Three dimensional (3-D) integration provides an effective platform for realizing improved circuits by integrating multiple layers of active devices on a single three dimensional chip. Three dimensional fabrication technologies can be broadly classified into two groups according to an integration scheme. The first technology is a three dimensional parallel integration scheme using through substrate via (TSV) based technology. Each active layer of the TSV based technology, along with respective interconnect metal layers, is fabricated separately and subsequently stacked using the through substrate vias to interconnect the active layers. The second technology is three dimensional monolithic integration, in which stacked active devices (e.g., transistors) are grown sequentially on the same substrate. In three dimensional (3-D) monolithic integration, a fabrication technology is selected to fabricate multiple layers of active-area (e.g., single crystal silicon (Si) or recrystallized poly-silicon) that are separated by interlayer dielectrics (ILDs) for 3-D circuit processing.

Figure 1:
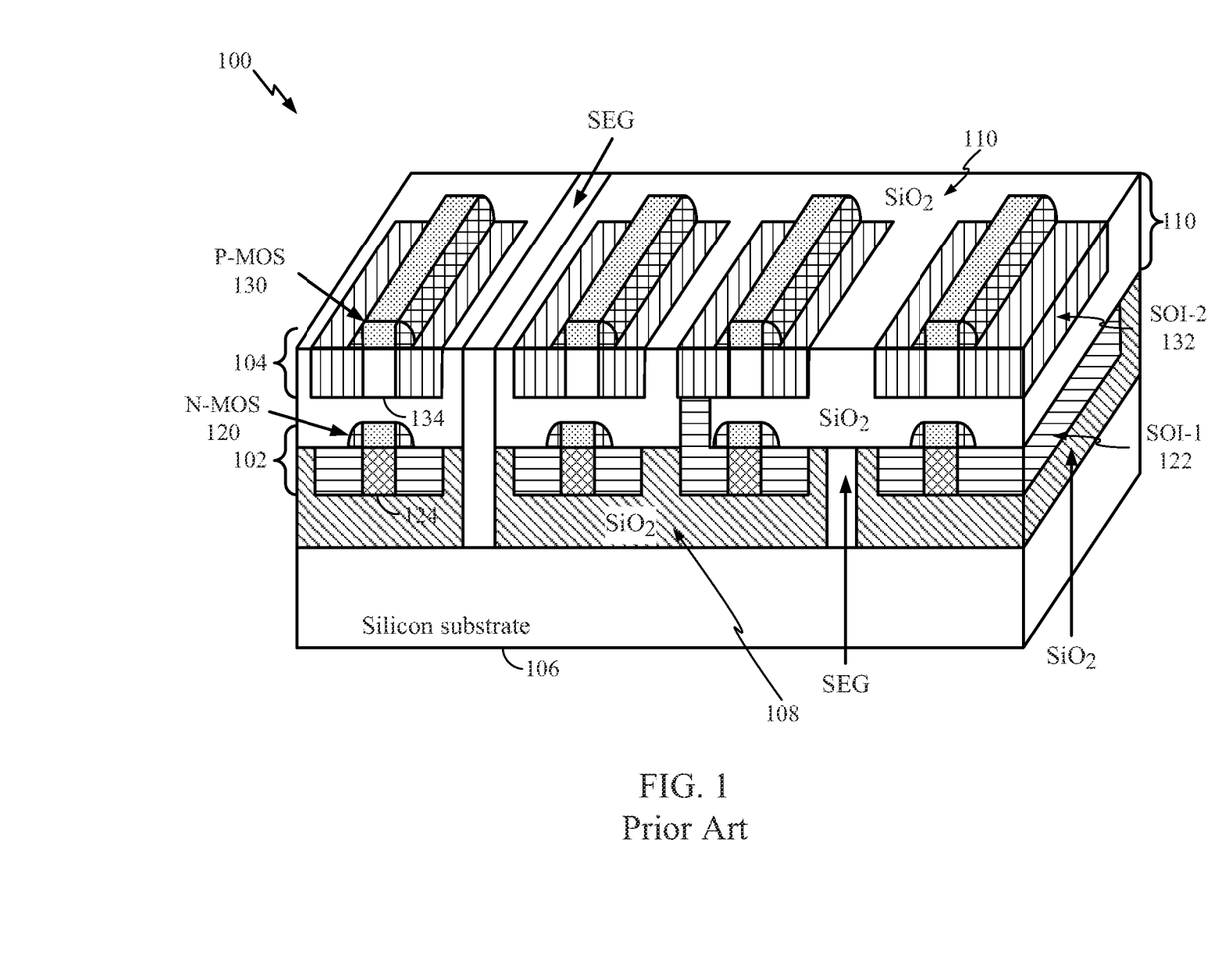
FIG. 1 illustrates a cross sectional view of a prior art three dimensional monolithic die with two active layers.

FIG. 1 illustrates a cross sectional view of a three dimensional monolithic die 100 with two active layers 102 and 104. In the three dimensional monolithic die 100, a second active layer 104 is fabricated on a first active layer 102. The second active layer 104, which includes P-MOS transistors 130, is aligned on top of the first active layer 102, which includes N-MOS transistors 120. The N-MOS transistors 120 are fabricated on a first silicon on insulator layer (SOI-1) 122, and the P-MOS transistors 130 are fabricated on a second silicon on insulator layer (SOI-2) 132.

The first active layer 102 and the second active layer 104 are sequentially grown on a silicon substrate 106. In particular, silicon epitaxial growth (SEG) is used to grow silicon crystal vertically and laterally to cover an interlayer dielectric (e.g., a first insulator layer 108 of silicon dioxide (SiO2)) on the silicon substrate 106. Devices (e.g., N-MOS transistors 120) within the first active layer 102 are fabricated on the grown layer 122. A second insulator layer 110 of SiO2 is deposited on the first active layer 102. Silicon epitaxial growth then grows another silicon on insulator layer (SOI-2) 132 on the second insulator 110. The devices (e.g., P-MOS transistors 130) within the second active layer 104 can be fabricated on the second silicon on insulator layer (SOI-2) 132 on top of the second insulator layer 110. Additional active layers may be fabricated above the second, active layer 104 using silicon epitaxial growth.

Figure 2:
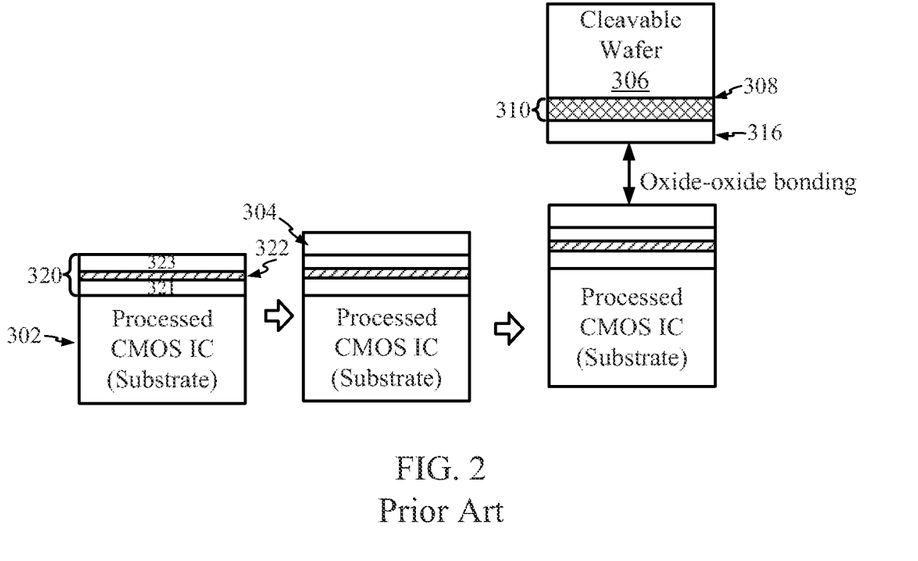
FIGS. 2-3 illustrate a prior art crystallized silicon layer transfer process flow.
Figure 3:
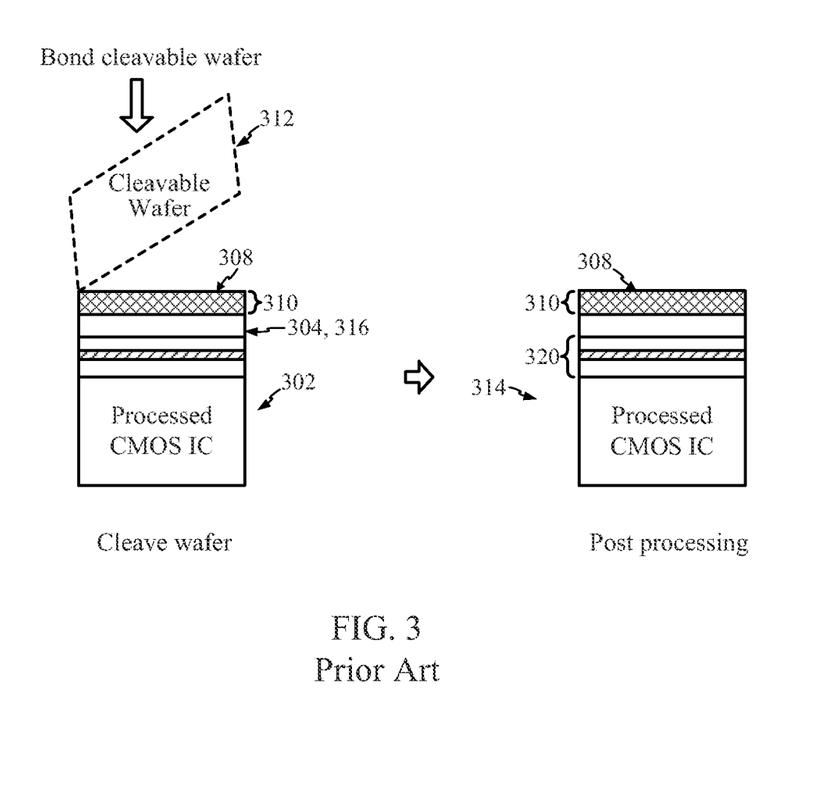

Currently, materials for 3-D monolithic integration include silicon and germanium. FIGS. 2-3 illustrate a conventional crystallized silicon layer transfer process flow. A wafer (or die) 302, including underlying CMOS (complementary metal oxide semiconductor) circuitry 320, is provided. The CMOS circuitry 320 may include device transistors 321 and conductive (e.g., metal) interconnects (such as a via layer 322 and a horizontal metal layer 323). Although only a single layer of vias 322 and a single horizontal layer 323 are shown, it is appreciated that multiple such layers exist.

An oxide layer 304 is deposited on top of the CMOS circuitry 320 of the wafer 302. A cleavable wafer 306 is then bonded onto the wafer 302 with an oxide-oxide bonding process. The cleavable wafer 306 includes a cut layer 308, a semiconductor layer 310, and an oxide layer 316. The semiconductor layer 310 may be a crystallized silicon the subsequently constructing transistors.

As seen in FIG. 3, after oxide-oxide bonding of the two wafers 302 and 306, a cutting step is performed to cleave and remove a top portion 312 of the cleavable wafer 306 along the cut layer 308. The result is a three dimensional wafer 314 that includes the wafer 302 with the crystallized silicon layer 310. An additional process may be performed to provide electrical connections (e.g., vertical vias) between any devices fabricated within the crystallized silicon layer 310 and the device transistors of the CMOS circuitry 320.

Fabrication of devices (e.g., transistors) in the crystallized silicon layer 310, however, is limited. Although this limitation is discussed generally with reference to silicon wafers, the limitation exists in conventional silicon CMOS process flows that involve ion-implants and activations. In particular, high temperatures are specified for fabricating devices in the crystallized silicon layer 310. Such high temperatures, however, damage the existing circuits 320 on the wafer 302. For example, the back end of line (BEOL) components (e.g., vias 322 and interconnecting metal lines 323 of the CMOS devices 320) would likely melt at the temperatures specified to fabricate devices in the crystallized silicon layer 310. That is, the high temperatures involved in silicon epitaxial growth cause significant degradation to the devices (e.g., N-MOS transistors 120) on lower layers (e.g., first active layer 102), as shown in FIG. 1.

To avoid the excessive heat specified for fabricating devices in the crystallized silicon layer 310, a lower quality material, such as polysilicon, is used for fabricating transistors in the crystallized silicon layer 310. For example, as shown in FIG. 1, a single crystal 124 is used in the fabrication of the N-MOS transistors 120. The use of a single crystal 124 provides improved electron mobility within the N-MOS transistors 120 to optimize the performance of the N-MOS transistors 120. The P-MOS transistors 130, however, are fabricated using a polysilicon 134 because such fabrication can be performed at a lower temperature that does not damage the BEOL components 323. Unfortunately, the P-MOS transistors 130 are not optimized for performance because polysilicon 134 exhibits reduced electron mobility as compared to the single crystal 124.

SUMMARY

According to one aspect of the present disclosure, a monolithic three dimensional (3-D) integrated circuit (IC) device is described. The monolithic 3-D IC device includes a first layer having first active devices. The monolithic 3-D IC device also includes a second layer having second active devices that each include a graphene portion. The second layer is fabricated on the first layer to form a stack of active devices.

According another aspect of the present disclosure, a method for manufacturing a monolithic 3-D IC device is described. The method includes fabricating a first layer having first active devices. The method also includes forming a stack of active devices by fabricating a second layer on the first layer. The second layer includes second active devices that each include a graphene portion.

According to a further aspect of the disclosure, a monolithic IC device is described. The 3-D IC device includes means for supporting a first layer having first active devices. The monolithic 3-D IC device also includes a second layer having second active devices that each include a graphene portion. The second layer is fabricated on the supporting means to form a stack of active devices.

This has outlined, rather broadly, the features and technical advantages of the present disclosure in order that the detailed description that follows may be better understood. Additional features and advantages of the disclosure are described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Three dimensional (3-D) integration provides an effective platform for realizing improved circuits by integrating multiple layers of active devices on a single three dimensional chip. 3-D parallel integration using through substrate via (TSV) based technology is one 3-D integration for providing stacked integrated circuit (IC) devices. Unfortunately, chip to chip alignment accuracy for proper TSV connection between the stacked IC devices limits the number of chip to chip connections due to misaligned TSV interconnections.

3-D monolithic integration overcomes some of these disadvantages. 3-D monolithic integration is a 3-D fabrication technologies in which stacked transistors are grown sequentially on the same wafer (substrate). As described herein, the term "substrate" may refer to a substrate of a diced wafer or may refer to the substrate of a wafer that is not diced. In 3-D monolithic integration, a fabrication technology is selected to fabricate multiple layers of active-area (e.g., single crystal silicon (Si) or recrystallized poly-Si) that are separated by interlayer dielectrics (ILDs) (e.g., SiO2) for 3-D circuit processing.

Use of a single crystal in the first active layer of a 3-D integrated circuit (IC) device provides improved electron mobility for optimized performance of the transistors in the first active layer. Unfortunately, thermal issues prevent the use of the single crystal silicon in the transistors of second and subsequent active layers. As explained previously, the thermal issue is that single crystal silicon requires higher temperatures for fabrication, which may damage other circuits on the 3-D IC device. As an alternative to the single crystals, the transistors in the second and subsequent layers may be fabricated with a material that does not require high temperatures to fabricate. Such an alternative material may be polysilicon. Polysilicon, however, is a lower quality material. As a result, transistors fabricated with polysilicon do not provide optimized performance because polysilicon transistors exhibit reduced electron mobility. Therefore, there is a need for an improved transistor.

Some aspects of the present disclosure use graphene transistors to implement three dimensional monolithic integration while overcoming the problems of the prior art. Graphene transistors can be fabricated at a lower temperature that does not damage the BEOL components. Furthermore, graphic based transistors exhibit improved electron mobility to provide optimized transistor performance.

In one configuration, a graphene film can be formed on a transitional substrate and transferred to a base substrate for patterning. In particular, graphene transistors can be fabricated by transferring a thin graphene film, grown on a layer of nickel (Ni) or copper (Cu) of the transitional substrate, for example, onto a base substrate. The base substrate may include an insulating layer of silicon oxide (SiO2) or polymer (PMMA), for example. Once transferred to the base substrate, the graphene film can be patterned into stripes to form devices (e.g., transistors) for logic operation. The process of patterning graphene is compatible with CMOS processes. In particular, graphene devices (e.g., transistors) can be fabricated while staying under a back end of the line (BEOL) thermal budget. That is, the BEOL components are not damaged from heat when fabricating the graphene devices.

Figure 4A:
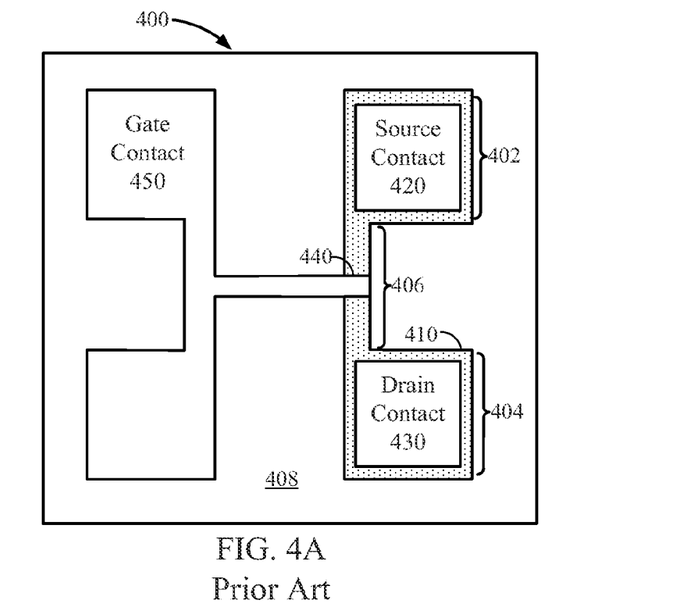
FIG. 4A illustrates a prior art graphene transistor derived from a transistor-fabrication sequence.

FIG. 4A illustrates an exemplary carbon based transistor, such as a graphene transistor 400, derived from a transistor-fabrication sequence. The fabrication process may start with a graphene film that is continuous across a separate transitional substrate (not shown). The graphene film can have the thickness of a single atomic layer (e.g., 0.3 nm) or can be a bi-layer. Specific portions of the graphene film may be patterned and etched, for example, with an oxygen plasma once transferred to a base substrate 408. The graphene portion 410 (after etching) becomes a source region 402, a drain region 404, and a conductive channel 406 of the graphene transistor 400. A lift-off process may pattern a source contact 420 and the a drain contact 430 of the graphene transistor 400.

To form a gate 440, a dielectric (not shown) may be deposited over the graphene portion 410, the base substrate 405, the source contact 420 and the drain contact 430. A gate layer is then deposited on a portion of the dielectric over and near the conductive channel 406, while holding the base substrate 408 to a predetermined temperature (e.g., 150 degrees centigrade). A gate contact 450 and the gate 440 may then be patterned by the lift-off process. The gate contact 450 and gate 440 may be composed of a titanium or platinum material. The dielectric may be etched over the source contact 420 and the drain contact 430 to enable access by interconnects (not shown).

Figure 4B:
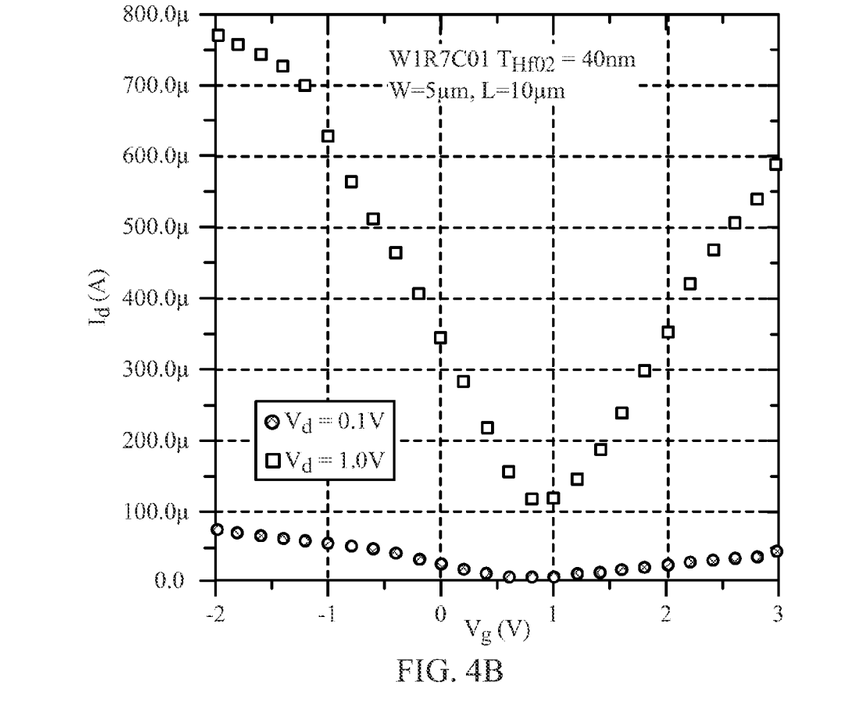
FIG. 4B illustrates a drain current versus gate voltage of the graphene transistor of FIG. 4A.

FIG. 4B illustrates a drain current (Id) versus gate voltage (Vg) of the graphene transistor 400 of FIG. 4A. The V-shaped drain current characteristic may be typical of semi-metal graphene devices, with electrons conducting for positive gate voltages and holes conducting for negative gate voltages. As a result, a drain current increases in both directions: for negative gate voltages because of hole conduction and for positive gate voltages because of electron conduction. Graphene transistors can be fabricated with semiconductor properties by opening a band gap. A band gap generally refers to an energy range in a solid where electron states do not exist. Without a band gap, graphene transistor cannot be effectively turned off, thereby reducing an on/off ratio of the device. For the purposes of this disclosure and depending on the type of transistor, turning a transistor ON may involve enabling a current to flow through the source and the drain. Similarly, turning a transistor OFF constrains current from flowing between the source and the drain of the transistor. In one configuration, a graphene transistor can have a higher on/off ratio by reducing a graphene film width to create a wider band gap.

FIGS. 5A-5E illustrate a monolithic three dimensional graphene-based semiconductor device at various stages of manufacture according to one aspect of the present disclosure. In particular, FIGS. 5A-5E illustrate a sequential fabrication approach that incorporates a thin layer of graphene on top of, for example, a back end of a first device layer. In another configuration, the graphene is replaced with a III-V compound semiconductor including but not limited to gallium arsenide (GaAs), indium phosphide (InP), and other like III-V compound semiconductor materials.

Figure 5A:
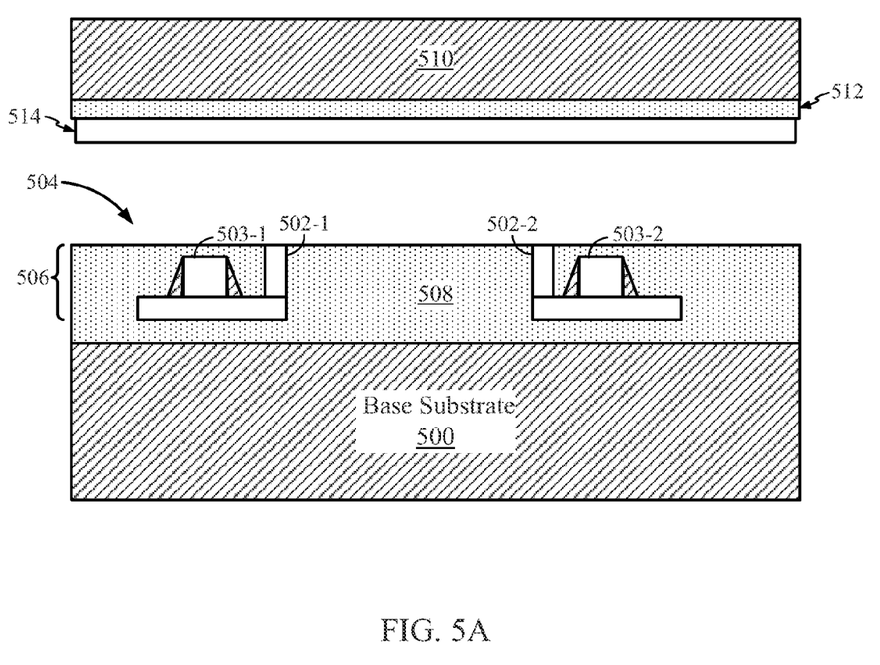
FIGS. 5A-5E illustrate a monolithic three dimensional graphene-based semiconductor device at various stages of manufacture according to some aspects of the disclosure.

Starting with FIG. 5A, a base substrate (e.g., a semiconductor wafer) 500 is provided. The base substrate 500 may be, for example, a silicon-based substrate, a glass-based substrate or other materials such as those implemented with bulk substrates for semiconductor wafers. Interconnects 502 may be fabricated on a front side 504 of the base substrate 500 along with active circuitry 503 (503-1, 503-2) to form first layer circuitry 506. Active circuitry 503 may include, for example, transistors, diodes and other like integrated circuits. The front side 504 of the base substrate 500 may include a first insulator layer 508 for isolating signals coming from various individual circuits of the active circuitry 503, and for protecting and/or isolating the first layer circuitry 506 from a subsequent layer of circuitry. In one aspect of the present disclosure, the active circuitry 503 and the interconnects 502 of the first layer circuitry 506 are fabricated in the same manner as in a conventional complementary metal-oxide-semiconductor (CMOS) two dimensional circuit. The first insulator layer 508 may be an oxide, a nitride or other like insulator material.

A transitional substrate 510 is also provided. In one aspect of the present disclosure, the transitional substrate 510 is similar in composition to the base substrate 500. The transitional substrate 510 may be silicon or quartz, for example. In this aspect of the present disclosure, the transitional substrate 510 is used to grow a graphene layer because a temperature for deposition of graphene on the base substrate 500 is the range of 800° to 1000°. In an alternative configuration, the graphene layer may be formed directly on the base substrate 500.

In one configuration, a graphene layer 514 is grown on a conductive layer 512 (e.g., nickel or copper) of the transitional substrate 510, and then transferred to the base substrate 500. Graphene can be deposited on the conductive layer 512 with a chemical vapor deposition (CVD) process or another suitable process for depositing a single layer of graphene film to form the graphene layer 514. The conductive layer 512 may facilitate growth of the graphene. A thickness of the graphene layer 514 may be in the range of 0.3 to 0.33 nanometers for a mono layer; a graphene multilayer may also be used.

In another configuration, the graphene layer 514 is grown directly on the transitional substrate 510, such as a boron nitride (BN) substrate. The graphene layer 514 may be formed on the transitional substrate 510 using any suitable process for depositing graphene (e.g., chemical vapor deposition).

Figure 5B:
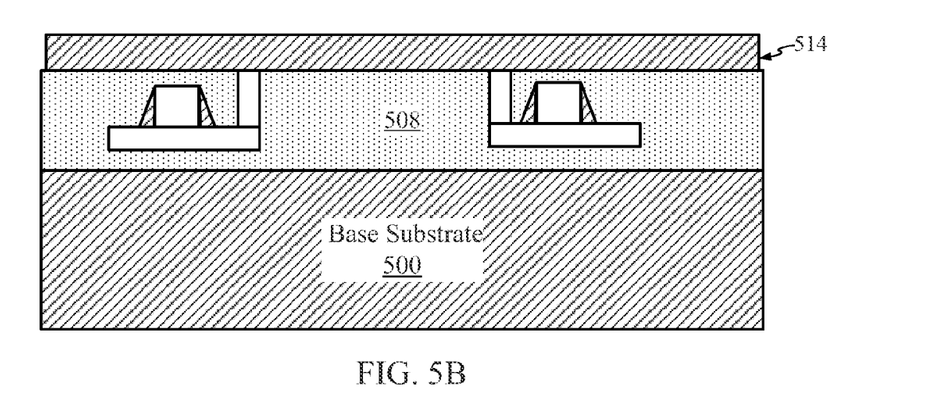

In FIG. 5B, the graphene layer 514 is transferred from the transitional substrate 510 (seen in FIG. 5A) to a surface on the first insulator layer 508 of the base substrate 500. The transitional substrate 510 is separated from the graphene layer 514 to enable the transfer of the graphene layer 514 to the first insulator layer 508 of the base substrate 500. In one aspect of the disclosure, the conductive layer 512 is etched away to release the graphene layer 514 from the transitional substrate 510.

Figure 5C:
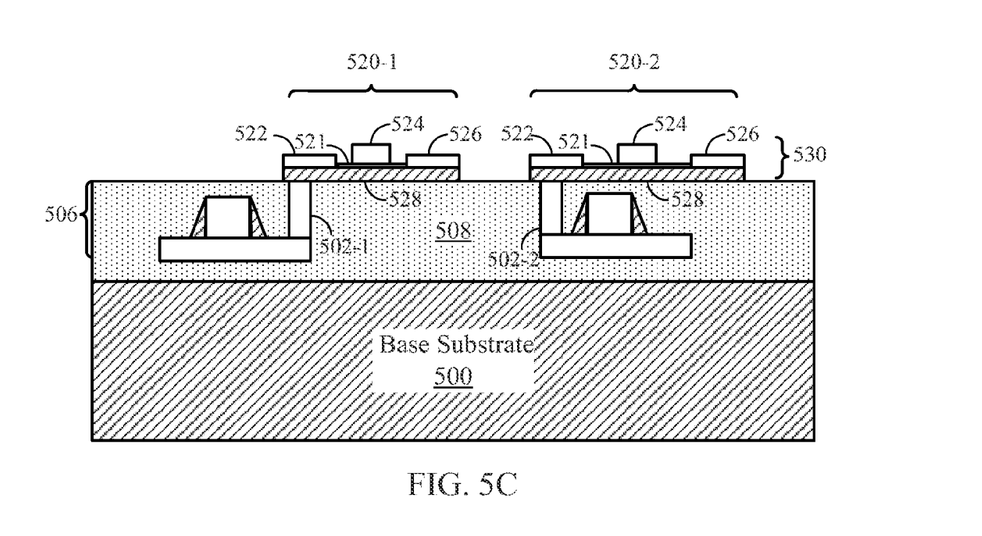

In FIG. 5C, second layer circuitry 530 is fabricated from the graphene layer 514. In one configuration, the graphene layer 514 is patterned into transistors 520 (520-1 and 520-2) to form the second layer circuitry 530. A patterned graphene portion becomes a source region under a source contact 522, a drain region under a drain contact 526, and a conductive channel 528 of the transistors 520. In one configuration, the transistors 520 include a gate and a gate contact 524 on a dielectric 521 over the conductive channel 528. In this configuration, the graphene operates as a conductive channel 528, as well as the source and drain regions of the transistors 520, with the gate contact 524 being composed of a conductive (e.g., metal) material.

In contrast to conventional materials, graphene can be patterned at a low temperature (e.g., <200 degrees centigrade) without high temperature thermal annealing specified for recrystallized poly-silicon. Therefore, the circuits in the first insulator layer 508 are not damaged because the high temperatures involved in, for example, silicon epitaxial growth for fabricating devices in recrystallized silicon are avoided by using graphene.

Figure 5D:
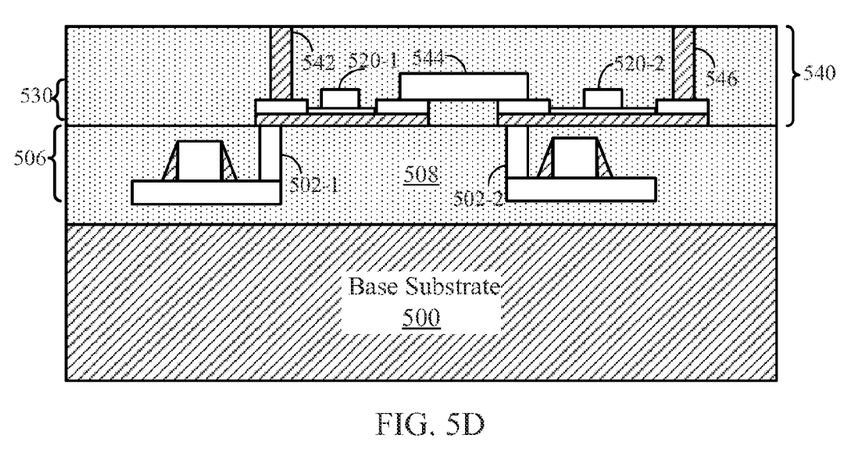

Interconnects 502 (502-1, 502-2) couple the first layer circuitry 506 to the transistors 520. Interconnects 542, 546 (seen in FIG. 5 D) may couple the integrated circuit devices (e.g., transistors) 520 of the second layer circuitry 530 to a subsequent layer of circuitry. In one aspect of the present disclosure, the interconnects may be graphene interconnects. The use of graphene for both the transistors and the interconnects is advantageous for meeting the back end of the line topography and thermal budget specifications.

Figure 5E:
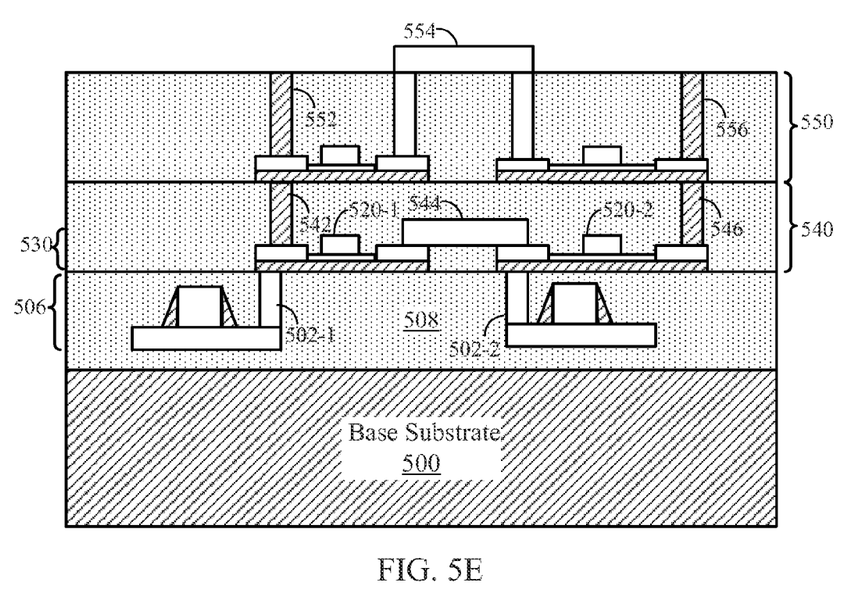

FIG. 5D illustrates fabrication of interconnects 542 and 546 for coupling the second layer circuitry 530 to a subsequent layer of circuitry. In this configuration, the interconnects 542 and 546 for coupling the second layer circuitry 530 to a subsequent layer of circuitry are fabricated using graphene. Once the interconnects 542 and 546 are fabricated in the second layer circuitry 530, an interconnect 544 can be patterned to couple the transistors 520-1 520-2 to each other. Another insulator layer 540 is formed over the transistors 520 and interconnects 542, 544, 546 as illustrated in FIG. 5D. The insulator layer 540 can protect and/or isolate the second layer circuitry 530 from a subsequent layer of circuitry. The entire process can be repeated to fabricate more layers 550 of active circuitry and interconnects 552, 554 and 556, as illustrated in FIG. 5E. The subsequent layers are substantially aligned with the previous layers and all the devices of the different layers are fabricated level by level on a single substrate.

Because the integrated circuit device of the second layer circuitry 530, for example, is fabricated on top of the first layer circuitry 506, a truly monolithic three dimensional circuit integration is accomplished using graphene. Alignment between the layers can be achieved for very small devices. In one aspect, the base substrate is a wafer that may be diced and subsequently packaged to create individual monolithic 3-D IC devices.

Although the previous description was with respect to graphene transistors, other types of graphene devices are also contemplated. For example, in another configuration, graphene sensors are fabricated.

Figure 6:
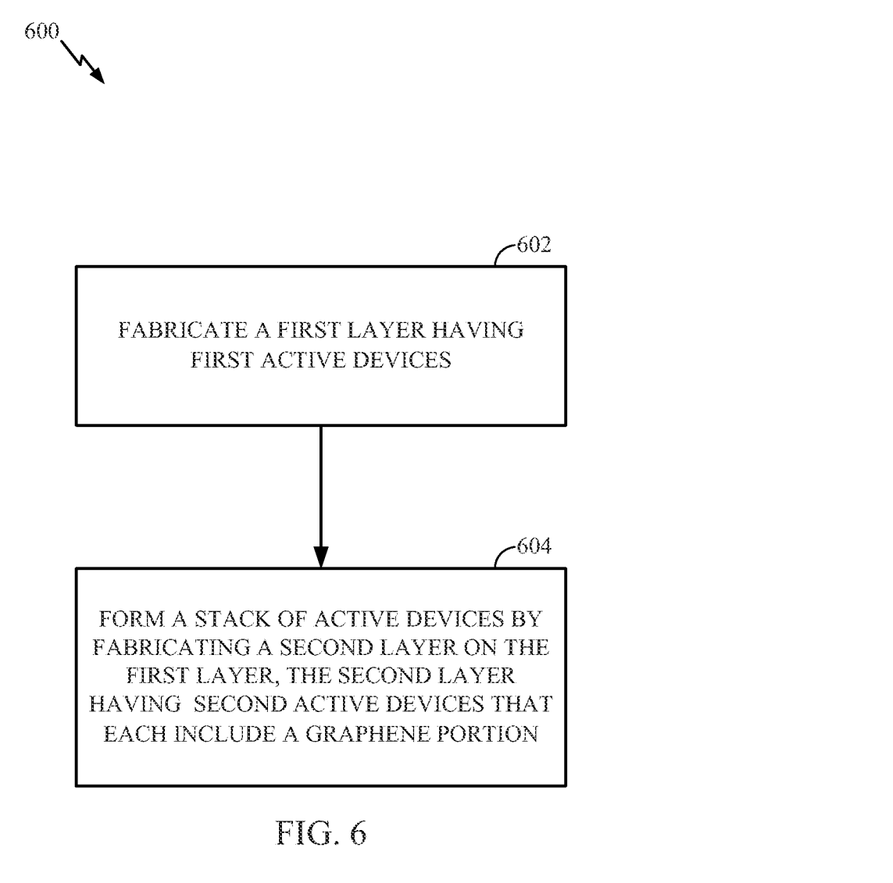
FIG. 6 illustrates a method for manufacturing a monolithic three dimensional integrated circuit (IC) device according to some aspects of the disclosure.

FIG. 6 illustrates a method 600 for manufacturing a monolithic three dimensional integrated circuit (IC) device according to some aspects of the disclosure. At block 602, a first layer having first active devices is fabricated. For example, interconnects 502 may be fabricated on a front side 504 of the base substrate 500 along with active circuitry 503 to form the first layer circuitry 506 as shown in FIG. 5A. At block 604, a stack of active devices is formed by fabricating a second layer having second active devices that each include a graphene portion. For example, a graphene layer 514 is grown on a conductive layer 512 of the transitional substrate 510, and then transferred to a base substrate 500. In this configuration, the graphene layer 514 is deposited on a first insulator layer 508 that surrounds the first layer circuitry 506. For example, in FIG. 5B, the graphene layer 514 is transferred from the transitional substrate 510 to a surface on the first insulator layer 508. In FIG. 5C, transistors 520 are fabricated from the graphene layer 514. In this configuration, the graphene layer 514 is patterned into transistors 520 along with interconnects 542, 544, 546 to form the second layer circuitry 530.

In one configuration, the monolithic three dimensional (3-D) integrated circuit (IC) device includes means for supporting a first layer of active devices. In one aspect of the disclosure, the supporting means is the base substrate 500 configured to perform the functions recited by the supporting means. The 3-D IC device also include means for fabricating a second layer of active devices, in which the fabricating means has a reduced temperature for fabrication and improved electron mobility. In this aspect of the disclosure, the fabricating means is the graphene layer 514 configured to perform the functions recited by the fabricating means. The fabricating means may be provided on the supporting means to form a stack of active devices. In another aspect, the aforementioned means may be any module or any apparatus configured to perform the functions recited by the aforementioned means.

Figure 7:
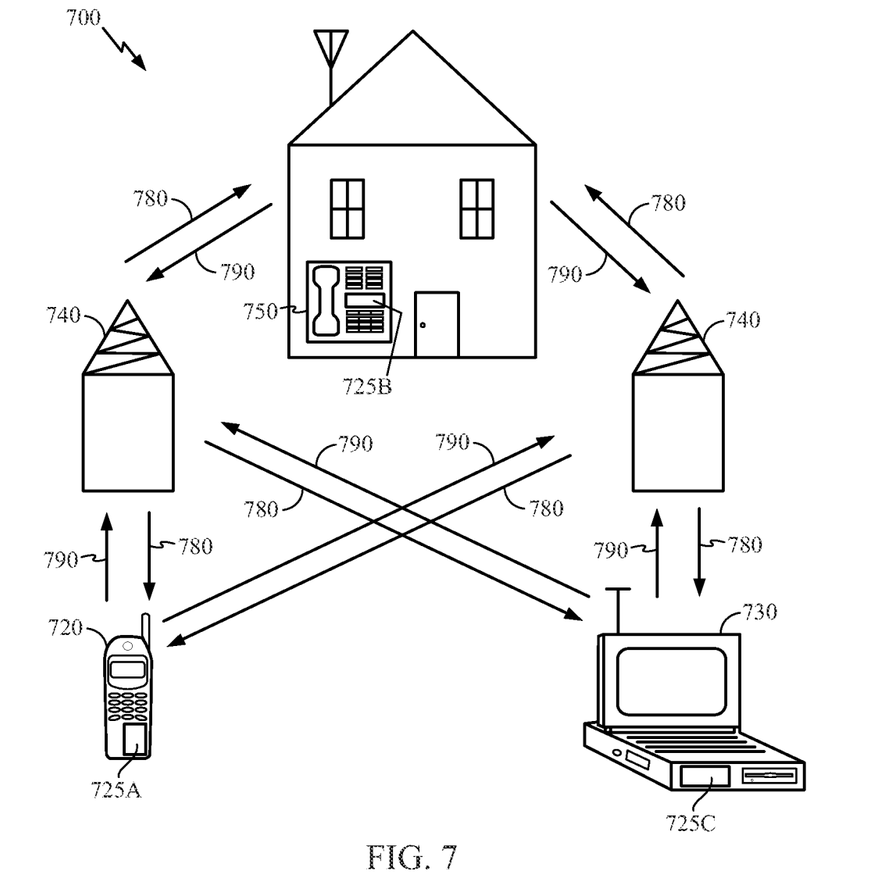
FIG. 7 illustrates an exemplary wireless communication system in which an aspect of the disclosure may be advantageously employed.

FIG. 7 illustrates an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C and 725B, which include the disclosed graphene devices. It will be recognized that other devices may also include the disclosed graphene devices, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 7 illustrates remote units according to the teachings of the disclosure, the disclosure is not limited to these exemplary illustrated units. Aspects of the disclosure may be suitably employed in any device, which includes the disclosed graphene devices.

Although the present teaching and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or are every substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A monolithic three dimensional integrated circuit (IC) device, comprising:
   a first layer comprising first active devices, wherein the first active devices do not include graphene; and
   a second layer comprising second active devices, each having a graphene portion, the second layer being fabricated on the first layer to form a stack of active devices, wherein the graphene portion is in direct contact with the first insulating layer.

2. The IC device of claim 1, further comprising a base substrate supporting the stack of active devices.

3. The IC device of claim 1, further comprising a first insulating layer surrounding on the first active devices.

4. The IC device of claim 3, further comprising interconnects extending through the first insulating layer and coupling to the first active devices.

5. The IC device of claim 4, further comprising a second insulating layer on the first insulating layer, the second insulating layer surrounding the second active devices.

6. The IC device of claim 5, further comprising graphene interconnects extending through the second insulating layer and coupling to the second active devices.

7. The IC device of claim 1, in which each of the first active devices and the second active devices is a transistor or a sensor.

8. The IC device of claim 1, further comprising an interconnect coupling the second active devices.

9. The IC device of claim 1, integrated into a mobile phone, a set top box, a music player, a video player, an entertainment unit, a navigation device, a computer, a hand-held personal communication systems (PCS) unit, a portable data unit, and/or a fixed location data unit.

10. A method for manufacturing a monolithic three dimensional integrated circuit (IC) device, comprising:
   fabricating a first layer having first active devices on a base substrate;
   growing a graphene layer on a conductive layer of a transitional substrate;
   transferring the graphene layer onto the first layer; and
   patterning and etching the graphene layer to form a graphene portion of a second layer having second active devices.

11. The method of claim 10, further comprising depositing a first insulating layer around the first active devices.

12. The method of claim 11, further comprising fabricating interconnects extending through the first insulating layer and coupling to the first active devices.

13. The method of claim 11, further comprising depositing a second insulating layer on the first insulating layer, the second insulating layer surrounding the second active devices.

14. The method of claim 13, further comprising fabricating graphene interconnects extending through the second insulating layer and coupling to the second active devices.

15. The method of claim 10, further comprising integrating the monolithic three dimensional integrated circuit (IC) device into a mobile phone, a set top box, a music player, a video player, an entertainment unit, a navigation device, a computer, a hand-held personal communication systems (PCS) unit, a portable data unit, and/or a fixed location data unit.

16. A monolithic three dimensional integrated circuit (IC) device, comprising:
   a first insulating layer comprising first active devices, wherein the first active devices do not include graphene; and
   a second layer comprising a means for fabricating second active devices, the fabricating means having a reduced temperature for fabrication and improved electron mobility, the fabricating means provided on the first insulating layer to form a stack of active devices, wherein the fabricating means is in direct contact with the first insulating layer.

17. The monolithic three dimensional integrated circuit (IC) device of claim 16, further comprising: means for coupling to the second layer of second active devices.

18. The monolithic three dimensional integrated circuit (IC) device of claim 16, integrated into a mobile phone, a set top box, a music player, a video player, an entertainment unit, a navigation device, a computer, a hand-held personal communication systems (PCS) unit, a portable data unit, and/or a fixed location data unit.

* * * * *